United States Patent
Carpi et al.

(10) Patent No.: US 6,801,314 B2
(45) Date of Patent: Oct. 5, 2004

(54) ALIGNMENT SYSTEM AND METHOD USING BRIGHT SPOT AND BOX STRUCTURE

(75) Inventors: Enio L. Carpi, Fishkill, NY (US); Bernhard Liegl, Cold Spring, NY (US); Peter Thwaite, Beacon, NY (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/967,299

(22) Filed: Sep. 28, 2001

(65) Prior Publication Data

US 2003/0064306 A1 Apr. 3, 2003

(51) Int. Cl.[7] .............................................. G01B 11/00
(52) U.S. Cl. ....................................................... 356/401
(58) Field of Search ................................. 356/399–401, 356/388, 614; 250/492.2, 491.1, 548, 559.29, 559.3, 559.36, 59, 55, 67, 77; 355/53, 55, 67, 77; 430/22, 30, 5; 382/151; 438/401

(56) References Cited

U.S. PATENT DOCUMENTS

| | | | | |
|---|---|---|---|---|
| 4,037,969 A | * | 7/1977 | Feldman et al. | 356/401 |
| 4,266,876 A | * | 5/1981 | Nakazawa et al. | 356/400 |
| 4,631,416 A | * | 12/1986 | Trutna, Jr. | 250/548 |
| 5,026,166 A | * | 6/1991 | van der Werf | 356/401 |
| 5,124,927 A | * | 6/1992 | Hopewell et al. | 700/121 |
| 5,182,455 A | * | 1/1993 | Muraki | 250/548 |
| 5,734,478 A | * | 3/1998 | Magome et al. | 356/401 |
| 5,863,712 A | * | 1/1999 | Von Bunau et al. | 430/396 |
| 5,968,693 A | * | 10/1999 | Adams | 430/30 |
| 6,309,800 B1 | * | 10/2001 | Okamoto | 430/311 |

\* cited by examiner

Primary Examiner—Zandra V. Smith
Assistant Examiner—Gordon J. Stock, Jr.
(74) Attorney, Agent, or Firm—Slater & Matsil, L.L.P.

(57) ABSTRACT

There is provided a method for aligning a semiconductor wafer and a mask. A semiconductor wafer is provided having an alignment mark formed thereon. A mask is provided having a pattern formed thereon. The mask is illuminated so as to create a bright spot thereon by a $0\_\pi$ phase conflict. The alignment mark is aligned with the bright spot, so as to align the semiconductor wafer with the mask. Preferably, the method includes the step of creating the alignment mark on the semiconductor wafer in a form of a frame. Moreover, preferably, the creating step includes the step of creating the frame to minimize an impact of film stack variations.

11 Claims, 4 Drawing Sheets

ALIGNMENT SYSTEM AND METHOD USING BRIGHT SPOT AND BOX STRUCTURE

BACKGROUND

1. Technical Field

The present invention generally relates to semiconductor fabrication and, in particular, to a system and method for aligning lithographic patterns using a bright spot created by a 0_π phase conflict at the mask level and a frame (e.g., box or other structure) at the wafer level.

2. Background Description

Semiconductor devices are processed in levels. Materials are formed in layers and patterned, typically using lithographic processes. To build devices and components on semiconductor devices, layers of materials are employed. These layers must be properly aligned so that patterns and components on different layers line up and function correctly once fabricated. Lithographic alignment on prior levels is critical to ensure proper overlay. Lithographic alignment typically includes providing a bullet and target arrangement where the bullet is an alignment mark to be aligned against a target alignment mark.

These alignment marks may include features with sharp edges, for example, trenches or plateaus formed on a layer of the semiconductor device. In an alignment, a reticle of an optical alignment device is aligned to a mark on a stepper, and then the wafer of the semiconductor device is aligned to the mark on the stepper.

Conventional alignment techniques during lithography may suffer from poor signal-to-noise ratio due to variation in the film stack forming the alignment mark. A 0_π phase conflict at the mask level generates a very bright spot when reflected light is measured.

SUMMARY OF THE INVENTION

The problems stated above, as well as other related problems of the prior art, are solved by the present invention, a system and method for aligning lithographic patterns using a bright spot created by a 0_π phase conflict at the mask level and a frame (e.g., box structure) at the wafer level.

As noted above, a 0_π phase conflict at the mask level generates a very bright spot when reflected light is measured. According to the present invention, alignment is obtained by superimposing this bright spot to a frame at the wafer level. As the frame may be, for example, a simple box structure, a simplified layout can be designed. Preferably, the frame is optimized to minimize the impact of film stack variations.

It is to be appreciated that because an alignment according to the present invention is performed directly between the mask and the wafer, the alignment is more accurate than that achieved by the prior art. The use of a bright spot transfers most of the burden of the illumination signal to the mask, alleviating the problems caused by film stack variation.

According to an aspect of the present invention, there is provided a method for aligning a semiconductor wafer and a mask. A semiconductor wafer is provided having an alignment mark formed thereon. A mask is provided having a pattern formed thereon. The mask is illuminated so as to create a bright spot thereon by a 0_π phase conflict. The alignment mark is aligned with the bright spot, so as to align the semiconductor wafer with the mask.

According to another aspect of the present invention, the method further comprises the step of creating the alignment mark on the semiconductor wafer in a form of a frame.

According to yet another aspect of the present invention, the creating step comprises the step of creating the frame to minimize an impact of film stack variations.

According to still another aspect of the present invention, there is provided a method for aligning a semiconductor wafer and a mask. A semiconductor wafer is provided having a film stack from which light is reflected and an alignment mark formed on the semiconductor wafer. A mask is provided having a pattern formed thereon. The mask is illuminated so as to create a bright spot thereon by a 0_π phase conflict during an illumination. The bright spot is independent of variations of the film stack. The alignment mark is aligned with respect to the bright spot, so as to align the semiconductor wafer with the mask independent of the variations of the film stack.

According to still yet another aspect of the present invention, there is provided a system for aligning a semiconductor wafer and a mask. An illumination tool irradiates the mask so as create a bright spot thereon by a 0_π phase conflict during an illumination. A detection tool detects the bright spot and the alignment mark. Alignment means aligns the alignment mark with the bright spot so as to align the semiconductor wafer with the mask.

These and other aspects, features and advantages of the present invention will become apparent from the following detailed description of preferred embodiments, which is to be read in connection with the accompanying drawings.

DETAILED DESCRIPTION OF PREFERRED EMBODIMENTS

The present invention is directed to a system and method for aligning lithographic patterns using a bright spot created by a 0_π phase conflict at the mask level and a frame (e.g., box structure) at the wafer level. As used herein, the phrases "bright spot" and "very bright spot" refer to a reflection of light that results from a 0_π phase conflict at the mask level, the reflection having an intensity greater than other reflections resulting from illumination of the mask. Thus, the reflection of light resulting from the 0_π phase conflict at the mask level is distinguishable from other reflections produced during an illumination by having a greater intensity than other reflections produced during the illumination. The 0_π phase conflict and bright spot resulting there from is the result of destructive interference between light passing through the 0 degree phase region with the light passing through the 180 degree (pi) region.

It is to be appreciated that while the present invention is primarily described with respect to the 0_π phase conflict at the mask level, any other high reflectively squared region at the mask level could also be used. However, such other high reflectively square region would cause a bright spot of less intensity than that caused by the 0_π phase conflict. In such a case, the bright spot of less intensity may not be the brightest reflected spot. Modification of the present invention to apply to such a case is readily ascertainable by one of ordinary skill in the related art. Moreover, given the teachings of the present invention provided herein, one of ordinary skill in the related art will contemplate these and other high reflectivity regions to which the present invention may be applied, while maintaining the spirit and scope of the present invention.

It should be understood that the elements shown in the FIGS. may be implemented in various forms of hardware, software or combinations thereof. Preferably, these elements are implemented on one or more appropriately programmed general purpose digital computers having a processor and memory and input/output interfaces. These elements may also by implemented on specially designed chips or software modules to provide the functionality in accordance with the present invention.

Figure 1A:
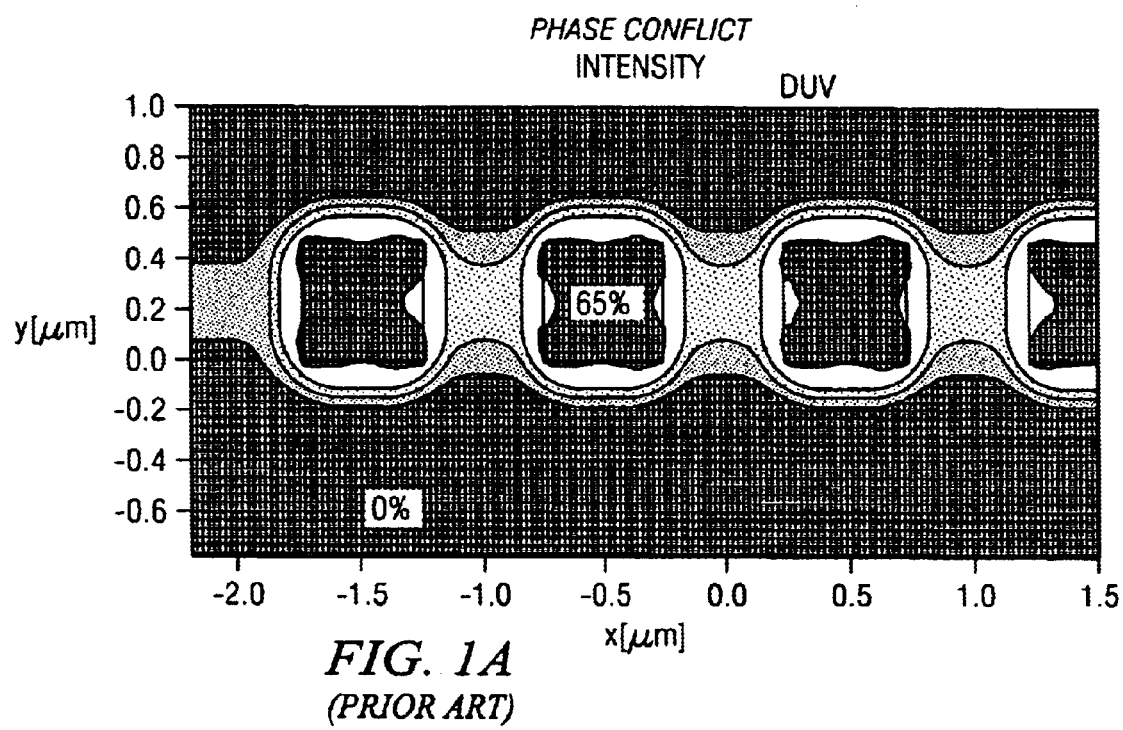
FIGS. 1A and 1B are simulated aerial images illustrating reflected values corresponding to a bright spot resulting from a 0_π phase conflict at the mask level of a semiconductor device, according to the prior art.
Figure 1B:
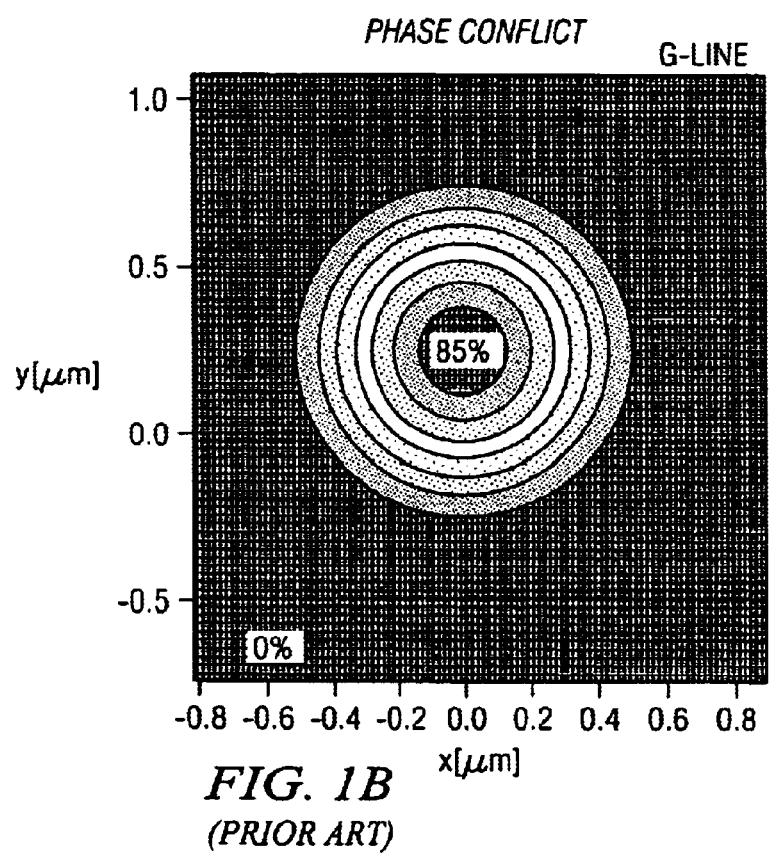

The present invention uses the combined image of a bright spot, originating from the mask, with a frame (e.g., box image), originated from the wafer. The bright spot can be obtained by a 0_π phase conflict in the mask as shown in the FIGS. 1A and 1B. FIGS. 1A and 1B are simulated aerial images illustrating reflected values corresponding to a bright spot resulting from a 0_π phase conflict at the mask level of a semiconductor device, according to the prior art. In particular, FIG. 1A corresponds to DUV lithography and FIG. 1B corresponds to g-line lithography. Based on simulations, the reflected intensity is 65% for DUV (248 nm) and 85% for g-line (436 nm). The different intensities are provided herein to illustrate that the bright spot can be formed using different wavelengths.

Figure 2:
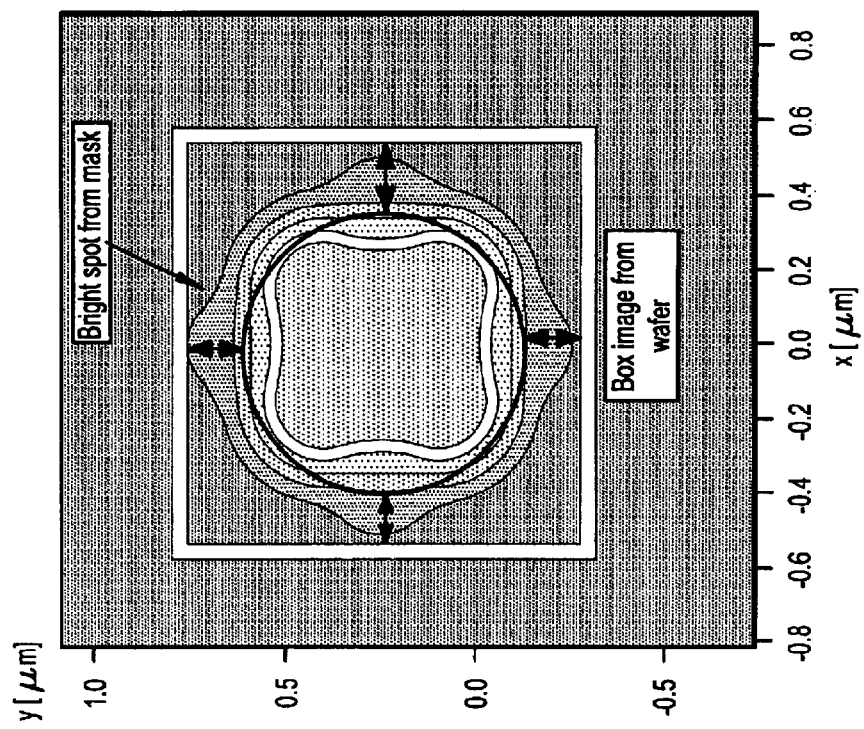
FIG. 2 is a simulated aerial image illustrating a bright spot superimposed to a frame (i.e., a box structure) on a wafer level of a semiconductor device, according to an illustrative embodiment of the present invention.

The formed bright spot is then superimposed to a frame originated from the wafer, as shown in FIG. 2. FIG. 2 is a simulated aerial image illustrating a bright spot superimposed to a frame (i.e., box structure) on a wafer level of a semiconductor device, according to an illustrative embodiment of the present invention. As the bright spot is generated by the 0_π phase conflict at the mask level, the bright spot is independent of any film stack variations that affect the performance of traditional alignment marks.

Figure 3:
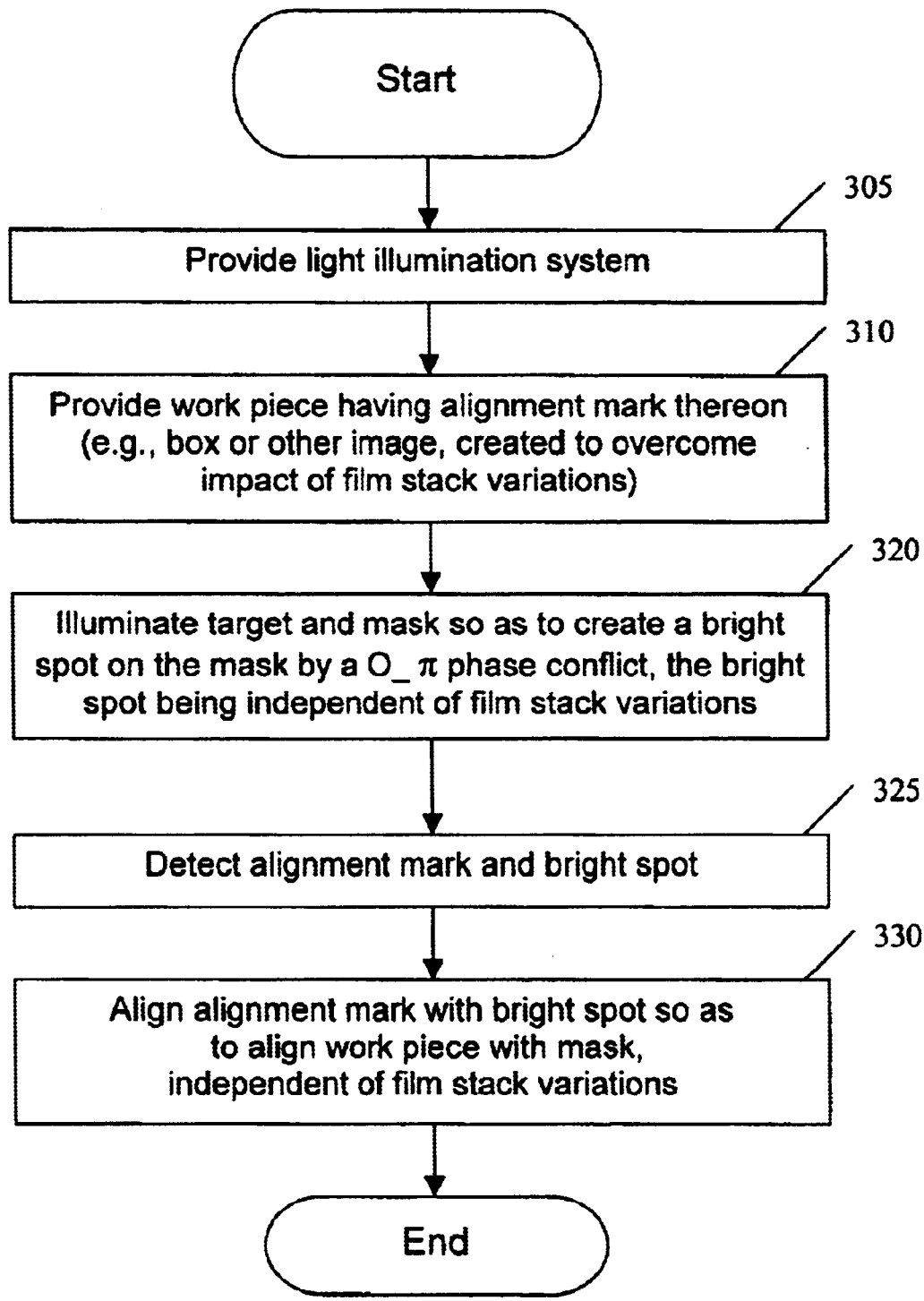
FIG. 3 is a flow diagram illustrating a method for aligning a work piece and mask, according to an illustrative embodiment of the present invention.

FIG. 3 is a flow diagram illustrating a method for aligning a work piece and mask, according to an illustrative embodiment of the present invention.

In block 305, a light illumination system is provided. The light illumination system may perform at least two roles, the roles being alignment of a mask to a work piece and exposure of the work piece to create features thereon. The light illumination system preferably includes a "through-the-lens" light illumination system optimized for a specific wavelength. As such, the illumination of the marks uses the same wavelength as that for exposure, and part of the main beam has to be diverted to the alignment system. As the alignment system can expose the resist, the beam intensity has to be small enough so as to be just enough to image the marks. It is to be appreciated that while the present invention is described with respect to a "through-the-lens" light illumination system, other illumination systems may also be employed, while maintaining the spirit and scope of the present invention. These systems are modified as described herein to provide the alignment capabilities as described in accordance with the present invention.

In block 310, a work piece is provided, such as a semiconductor device or an object with a pattern to be recognized. The work piece includes an alignment mark against which a mask (e.g., photomask, etch mask, and so forth) is to be aligned. In a preferred embodiment, the work piece is a semiconductor wafer and the alignment mark is a frame in the shape of a box structure. Of course, other layers and other structures of various shapes may also be employed, while maintaining the spirit and scope of the present invention.

It is further preferable that block 310 includes the step of creating the alignment mark such that the use of the bright spot transfers most of the burden of the illumination signal to the mask, alleviating the problems caused by film stack variation. Factors to be considered in creating the alignment mark include, for example, the material used to create the alignment mark, and the shape of the alignment mark, to name a few. Given the teachings of the present invention provided herein, one of ordinary skill in the related art will contemplate these and various other factors to be considered in creating the alignment mark so as to transfers most of the burden of the illumination signal to the mask to alleviate the problems caused by film stack variation, while maintaining the spirit and scope of the present invention.

The illumination system provided in step 305 includes an exposure system and a detection system. In block 320, the mask and the work piece are illuminated by the exposure system. Such illumination is performed so as to create a bright spot on the mask by a 0_π phase conflict during the illumination. It is to be appreciated that the bright spot is independent of any film stack variations.

In block 325, the detection system is employed to determine the location of the alignment mark on the work piece as well as the bright spot on the mask.

In block 330, the alignment mark (e.g., box structure) on the work piece is aligned with the bright spot on the mask, so as to align the work piece with the mask. It is to be appreciated that such alignment is independent of any film stack variations.

Figure 4:
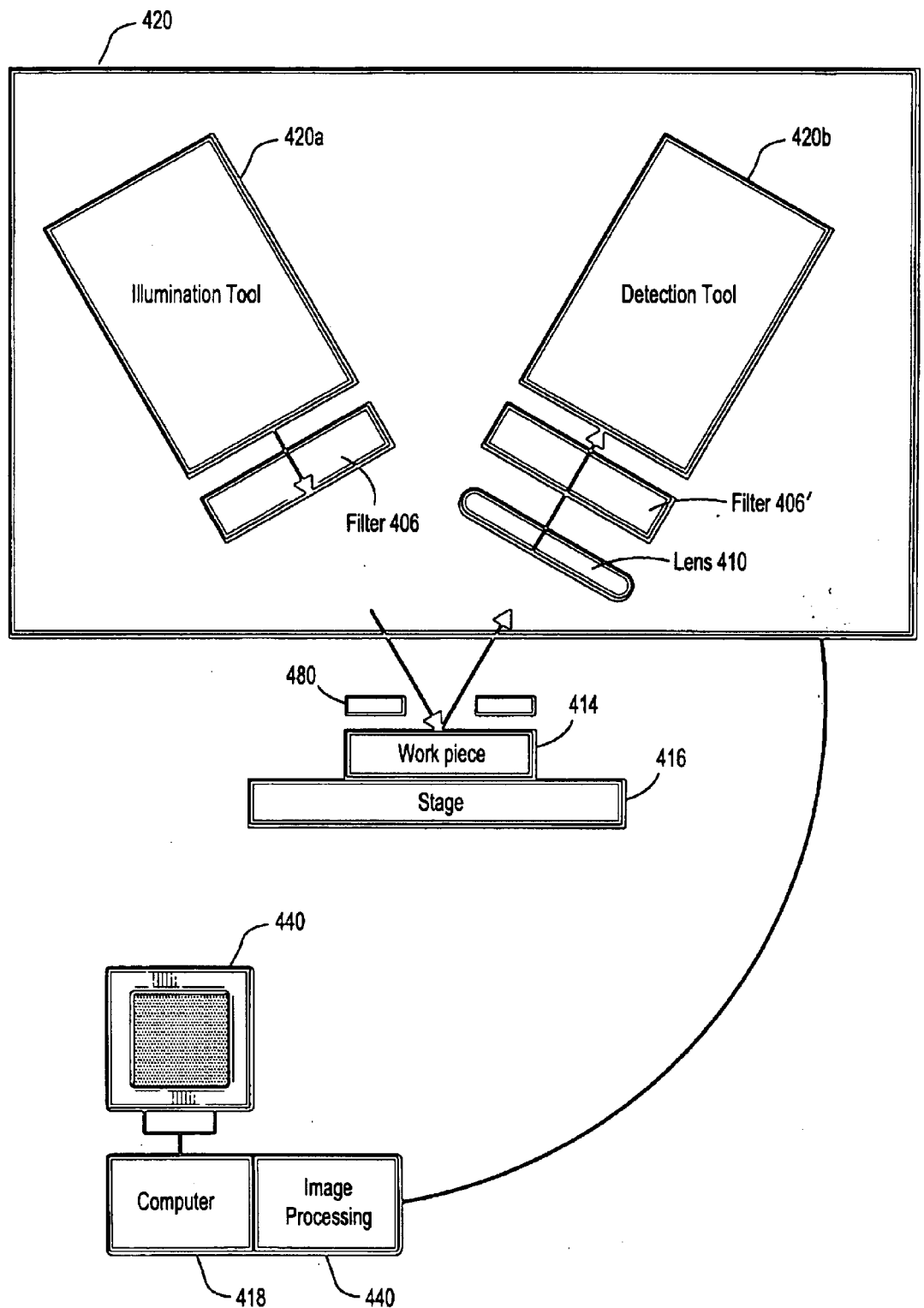
FIG. 4 is a block diagram illustrating a system for aligning a work piece and mask, according to an illustrative embodiment of the present invention.

FIG. 4 is a block diagram illustrating a system 400 for aligning a work piece and mask, according to an illustrative embodiment of the present invention.

The system 400 includes an illumination system 420. The illumination system 420 may perform at least two roles, the roles being alignment of a mask to a work piece and exposure of the work piece to create features thereon.

The illumination system 420 includes an exposure or illumination tool (hereinafter "illumination tool") 420a for providing light to at least illuminate a mask 480 and a work piece 414. The illumination tool 420 may be, for example, a broadband illumination tool, a single wavelength illumination tool, or any other type of illumination or exposure tool. Preferably, the illumination tool 420 is a "through-the-lens" system.

Work piece 414 may include a semiconductor wafer where alignment is needed between a prior layer and a new layer to be formed on the prior layer. Work piece 414 may alternately include an object or device where pattern recognition is needed.

Illumination tool 420a propagates light onto the mask 480 and the target (work piece 414). In preferred embodiments, light from illumination tool 420a passes through a filter module 406 either before hitting the target (e.g., work piece 414) or after being reflected from the target. An additional filter module 406' may be included at a detection tool 420b (included in illumination system 420) to filter light, which has been reflected from the target. The additional filter module 406' may be included in addition to or instead of the filter module 406. Filter modules may both be included to increase the number of available filters or to provide additional filtering. Given the teachings of the present invention provided herein, one of ordinary skill in the related art will contemplate these and various other configurations and alternations of the elements of system 400, while maintaining the spirit and scope of the present invention.

Detection tool 420b includes sensors for the detection of light reflected back from the mask 480 as well as the target (work piece 414). Illumination and detection tools 420a and 420b, respectively, may be the type commonly provided on illumination systems. Thus, it is to be appreciated that, for the sake of brevity, some components typically found in an illumination system are not shown and described but may nonetheless be included in illumination system 420, while maintaining the spirit and scope of the present invention. Such components may include, for example, an adjustable or variable aperture for the detection tool 420b.

Lens 410 collects reflected light from the target and the mask 480. After collecting light from the target and the mask 480, a computer 418 is preferably employed to automatically control a stage 416, which adjusts the position of work piece 414, as is known in the art. The computer 418 may include a display 440 for user interaction/monitoring with respect to the alignment. Moreover, the alignment provided by the computer 418 may be implemented with user intervention and/or an image processing program 440 stored on the computer 418.

The present invention relies upon imaging of the marks. The present invention advantageously overcomes limitations of the phase based alignment marks. Preferably, as noted above, the box frame is designed with dimensions such that the use of the bright spot transfers most of the burden of the illumination signal to the mask, alleviating the problems caused by film stack variation.

It is to be appreciated that while preferred embodiments of the present invention have been described herein with the alignment mark on the work piece being a box structure or box image, other shapes may be employed with the goal being to frame the bright spot. Thus, for example, a shape similar to the letter C could also be used, as well as a triangle, a rectangle, a polygon, or any other that allows for orientation of the work piece with the bright spot. However, it is to be appreciated that with increases in the complexity of the shape of the alignment mark come increases in the manufacturing of the mark which negate some of the gains that could be achieved with more simple alignment marks. Given the teachings of the present invention provided herein, one of ordinary skill in the related art will contemplate these and various other alignment marks on the work piece which maintain the spirit and scope of the present invention.

Although the illustrative embodiments have been described herein with reference to the accompanying drawings, it is to be understood that the present invention is not limited to those precise embodiments, and that various other changes and modifications may be affected therein by one of ordinary skill in the related art without departing from the scope or spirit of the invention. All such changes and modifications are intended to be included within the scope of the invention as defined by the appended claims.

What is claimed is:

1. A system for aligning a semiconductor wafer and a mask, comprising:

an illumination tool for irradiating the mask so as to create a bright spot thereon by a $0\_\pi$ phase conflict during an illumination;

a detection tool for detecting the bright spot and an alignment mark on the semiconductor wafer; and alignment means for aligning the alignment mark with the bright spot so as to align the semiconductor wafer with the mask.

2. The system according to claim 1, wherein the alignment mark on the semiconductor wafer is in a form of a frame.

3. The system according to claim 2, wherein the frame is created to minimize an impact of film stack variations.

4. The system according to claim 1, wherein the alignment mark on the semiconductor wafer is in a form of a box structure.

5. The system according to claim 4, wherein the box structure is created to minimize an impact of film stack variations.

6. The system according to claim 1, wherein the illumination tool generates the alignment mark in a form of a frame.

7. The system according to claim 6, wherein the illumination tool generates the frame to minimize an impact of film stack variations.

8. The system according to claim 1, wherein the illumination tool generates the alignment mark in a form of a box structure.

9. The system according to claim 8, wherein the illumination tool generates the box structure to minimize an impact of film stack variations.

10. A system for aligning a mask and a semiconductor wafer having thereon an alignment mark, comprising:

an illumination tool for irradiating the mask to create a bright spot thereon;

a detection tool for detecting the bright spot and the alignment mark;

alignment means for aligning the alignment mark with the bright spot so as to align the semiconductor wafer with the mask; and wherein the alignment mark is in a form of a frame.

11. The system according to claim 10, wherein the alignment means is for framing the bright spot within the alignment mark.

* * * * *